US008810438B2

(12) United States Patent
Tsai et al.

(10) Patent No.: US 8,810,438 B2
(45) Date of Patent: Aug. 19, 2014

(54) MEMBRANE CIRCUIT BOARD AND KEYBOARD HAVING THE SAME

(75) Inventors: Ching-Cheng Tsai, Keelung (TW); Cheng-Hui Shen, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 603 days.

(21) Appl. No.: 13/161,231

(22) Filed: Jun. 15, 2011

(65) Prior Publication Data

US 2012/0235837 A1 Sep. 20, 2012

(30) Foreign Application Priority Data

Mar. 18, 2011 (TW) ............................. 100204912 U

(51) Int. Cl.

| | |
|---|---|
| ***H03K 17/94*** | (2006.01) |
| ***F21V 33/00*** | (2006.01) |
| ***G09G 3/36*** | (2006.01) |
| ***H01H 9/00*** | (2006.01) |
| ***H01H 9/18*** | (2006.01) |
| ***H01H 13/83*** | (2006.01) |

(52) U.S. Cl.

CPC ........... *H01H 9/18* (2013.01); *H01H 2219/044* (2013.01); *H01H 2209/06* (2013.01); *H01H 2209/082* (2013.01); *H01H 13/83* (2013.01); *H01H 2219/062* (2013.01); *H01H 2211/004* (2013.01)

USPC .............. 341/22; 341/31; 341/34; 362/23.16; 362/85; 362/382; 362/555; 345/102; 345/170; 200/315; 200/319; 200/341

(58) Field of Classification Search

CPC ............................. H01H 3/125; H01H 13/702

USPC .......... 341/22, 34, 31; 362/602, 23.03, 23.16, 362/26, 555, 85, 382, 84, 88, 29; 200/314, 200/5 A, 319, 341, 315; 345/170, 102

See application file for complete search history.

(56) References Cited

U.S. PATENT DOCUMENTS

| | | | | |
|---|---|---|---|---|
| 6,590,508 | B1 * | 7/2003 | Howell et al. | 341/22 |
| 7,172,303 | B2 * | 2/2007 | Shipman et al. | 362/29 |
| 8,071,900 | B2 * | 12/2011 | Hsu et al. | 200/314 |
| 8,207,462 | B2 * | 6/2012 | Tsai | 200/310 |
| 8,334,794 | B2 * | 12/2012 | Watanabe et al. | 341/22 |
| 8,431,843 | B2 * | 4/2013 | Chen | 200/5 A |
| 2011/0158728 | A1 * | 6/2011 | Ho et al. | 400/472 |

* cited by examiner

*Primary Examiner* — Daniel Wu
*Assistant Examiner* — Mancil Littlejohn
(74) *Attorney, Agent, or Firm* — Michael A. Glenn; Perkins Coie LLP

(57) ABSTRACT

A membrane circuit board and a keyboard device having the same are provided in the invention. The membrane circuit board is defined with a plurality of key regions. Each of the key regions is with a pressing region and at least one light-pervious region thereon. The membrane circuit board comprising at least two light-pervious membranes stacked with each other, and at least one light-pervious adhesive layer sandwiched between the two light-pervious membranes and at least fully filled in the light-pervious region.

14 Claims, 11 Drawing Sheets

MEMBRANE CIRCUIT BOARD AND KEYBOARD HAVING THE SAME

RELATED APPLICATIONS

This application claims priority to Taiwan Application Serial Number 100204912, filed Mar. 18, 2011, which is herein incorporated by reference.

BACKGROUND

1. Technical Field

The present invention relates to a keyboard, more particular to a keyboard with light emitting characteristics.

2. Description of Related Art

At present, in order to overcome issues of keyboards being recognized or operated inconveniently by users under a dusk environment, no matter what kinds of the keyboard implemented on a desktop computer, a laptop computer, a notebook computer or a network TV, the related industries have launched a lot of types of light-emitting keyboards to the consuming markets. Each of the emitting keyboards is provided with a built-in typed emitting module therein such that the emitting module projects lights outwardly through key caps of the emitting keyboards so as to assist the users to clearly identify the represented characters and the clicked position of each key caps of the light-emitting keyboards.

Normally, a light-emitting keyboard specifically includes an emitting layer, a membrane circuit layer and a keycap layer from bottom to up. The membrane circuit layer is sandwiched between the emitting layer and the keycap layer, and the membrane circuit layer has a plurality of stacked membranes and a matrix circuit sandwiched between two of the membranes. The matrix circuit is provided with a plurality of pressing switches thereon. The keycap layer includes a plurality of keycaps and elastic elements, in which the keycaps are corresponded respectively to the elastic elements one on one, and the elastic elements are corresponded respectively to the pressing switches one on one. Therefore, while each keycap is pressed, the corresponding elastic element can be moved to trigger the corresponding pressing switch.

Moreover, since the emitting layer is positioned under the membrane circuit layer, the emitting layer can provide lights up to the key caps through the membrane circuit layer. Thus, the key caps are lightened. Therefore, when lights are outputted from the emitting layer through the membrane circuit layer, the lights are still resisted by the abovementioned membranes to generate light diffusion effect so as to affect the efficiency that the lights passed to the keycaps, and to degrade brightness of the outputting light source of the light-emitting keyboard.

SUMMARY

The present invention is to disclose a membrane circuit board and keyboard having the same, which can avoid unnecessary consumptions in light, so as to increase light emitting efficiency and advance light outputting brightness of light source.

The present invention is to disclose a membrane circuit board and keyboard having the same, which can enhance isolations between printed circuit patterns and external moisture.

According to one practiced embodiment, the keyboard of the present invention includes a keycap, an emitting layer, a elastic element, and a membrane circuit board. The keycap comprises a light-pervious pattern. The emitting layer outputs lights towards the keycap. The elastic element is arranged between the keycap and the emitting layer, and couples to the keycap. The membrane circuit board is arranged between the elastic element and the emitting layer, and the membrane circuit board has a pressing region and at least one light-pervious region thereon. The pressing region is aligned with the elastic element, and the light-pervious region is at least located at a vertical projection zone vertically projected on the membrane circuit board by the light-pervious pattern. The membrane circuit board comprises a plurality of light-pervious membranes and at least one light-pervious adhesive layer. The light-pervious membranes are stacked with each other. The light-pervious adhesive layer is sandwiched between every two neighboring light-pervious membranes, and fully filled in the light-pervious region.

In one variation of the practiced embodiment, the light-pervious region is only located in the vertical projection zone, and the area of the light-pervious region is equal to the area of the light-pervious pattern.

In another variation of the practiced embodiment, the area of the light-pervious region is specifically equal to the area of the membrane circuit board, which means the area of the light-pervious region is greater than the area of the light-pervious pattern. Also, the light-pervious region surrounds the pressing region in which the pressing region is hollow and surrounded completely by the light-pervious adhesive layer.

In one variation of the practiced embodiment, the membrane circuit board is defined with a plurality of key regions in which each of the key regions is defined with a pressing region and at least one light-pervious region thereon. The membrane circuit board comprises a first light-pervious membrane, a second light-pervious membrane, and at least one light-pervious adhesive layer. The first light-pervious membrane is stacked on one side of the second light-pervious membrane. The light-pervious adhesive layer is sandwiched between the first light-pervious membrane and the second light-pervious membrane, and fully filled in the light-pervious region.

In another variation of the practiced embodiment, the membrane circuit board is defined with a plurality of pressing regions thereon and a single light-pervious region surrounding the pressing regions. The membrane circuit board comprises a first light-pervious membrane, a second light-pervious membrane, and at least one light-pervious adhesive layer. The first light-pervious membrane is stacked on one side of the second light-pervious membrane. The light-pervious adhesive layer is sandwiched between the first light-pervious membrane and the second light-pervious membrane, and comprises a light-pervious adhesive material and a plurality of hollow portions. The light-pervious adhesive material is fully filled in the light-pervious region only. The hollow portions are arranged in the light-pervious adhesive layer, and correspondingly aligned to the pressing regions one on one.

To sum up, since the light-pervious adhesive layer sandwiched between the light-pervious membranes of the keyboard is fully filled in the light-pervious region thereof, thus, when lights are outputted from the emitting layer through the membrane circuit layer, the lights hardly generate light diffusion effect so as to avoid unnecessary consumptions of light, to increase light emitting efficiency and advance light outputting brightness of light source.

BRIEF DESCRIPTION OF THE DRAWINGS

The present invention will be apparent to those skilled in the art by reading the following detailed description of a preferred embodiment thereof, with reference to the attached drawings, in which.

DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

To sum up, since the light-pervious adhesive layer sandwiched between the light-pervious membranes of the keyboard is fully filled in the light-pervious region thereof, thus, when lights are outputted from the emitting layer through the membrane circuit layer, the lights hardly generate light diffusion effect so as to avoid unnecessary consumptions of light, to increase light emitting efficiency and advance light outputting brightness of light source.

The present invention is to disclose a membrane circuit board and keyboard having the same, which fully fills a light-pervious adhesive layer between every two neighboring layers of the membrane circuit board correspondingly aligned to the positions of light paths. Therefore, when lights are passed through the membrane circuit board, since the light-pervious adhesive layer between the neighboring layers of the membrane circuit board is fully filled in the positions of the light paths, the present invention can avoid unnecessary consumptions in light, so as to increase light emitting efficiency and advance light outputting brightness of light source.

Figure 1:
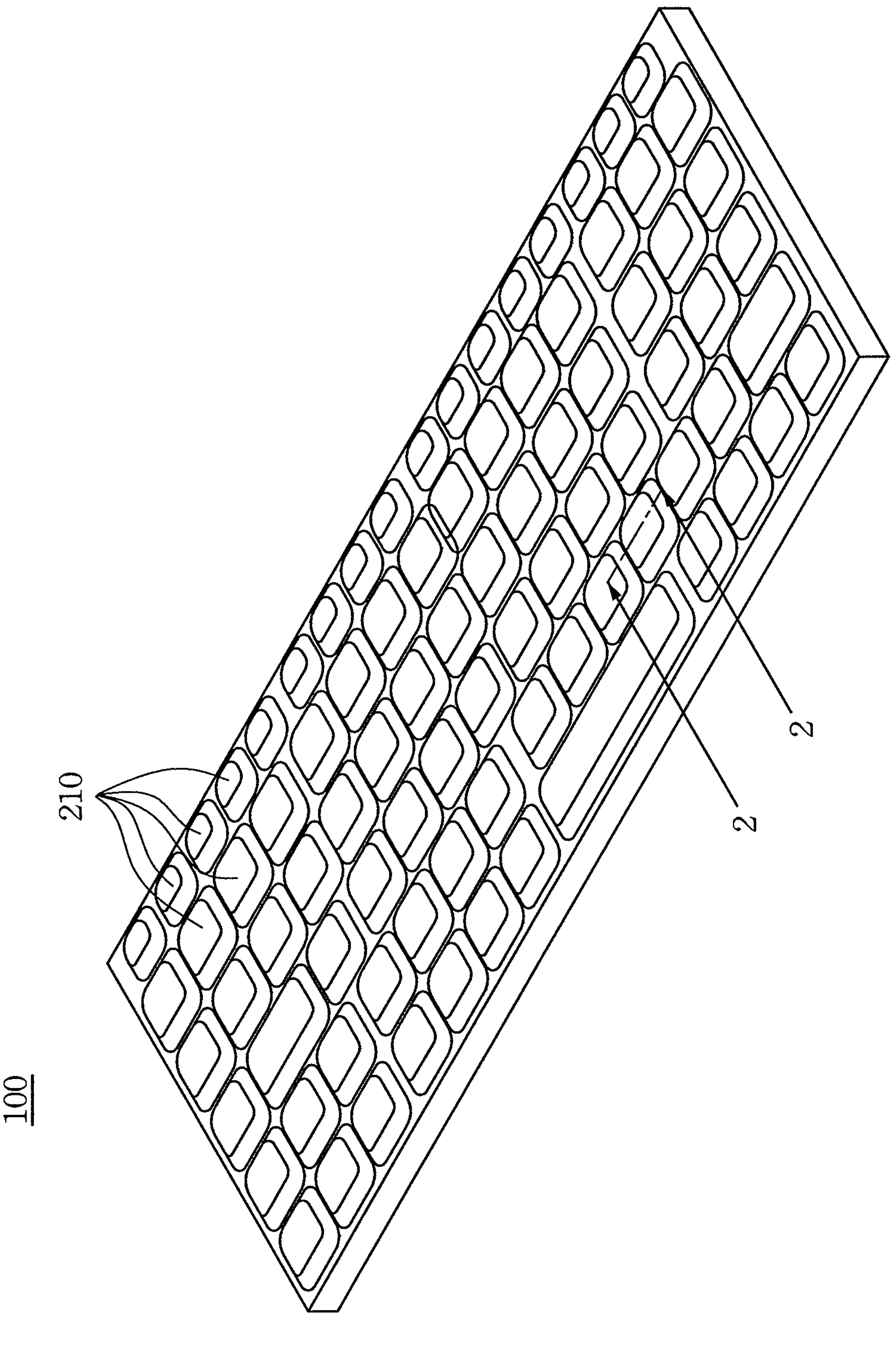
FIG. 1 is a schematic view of a keyboard of the present invention.
Figure 2:
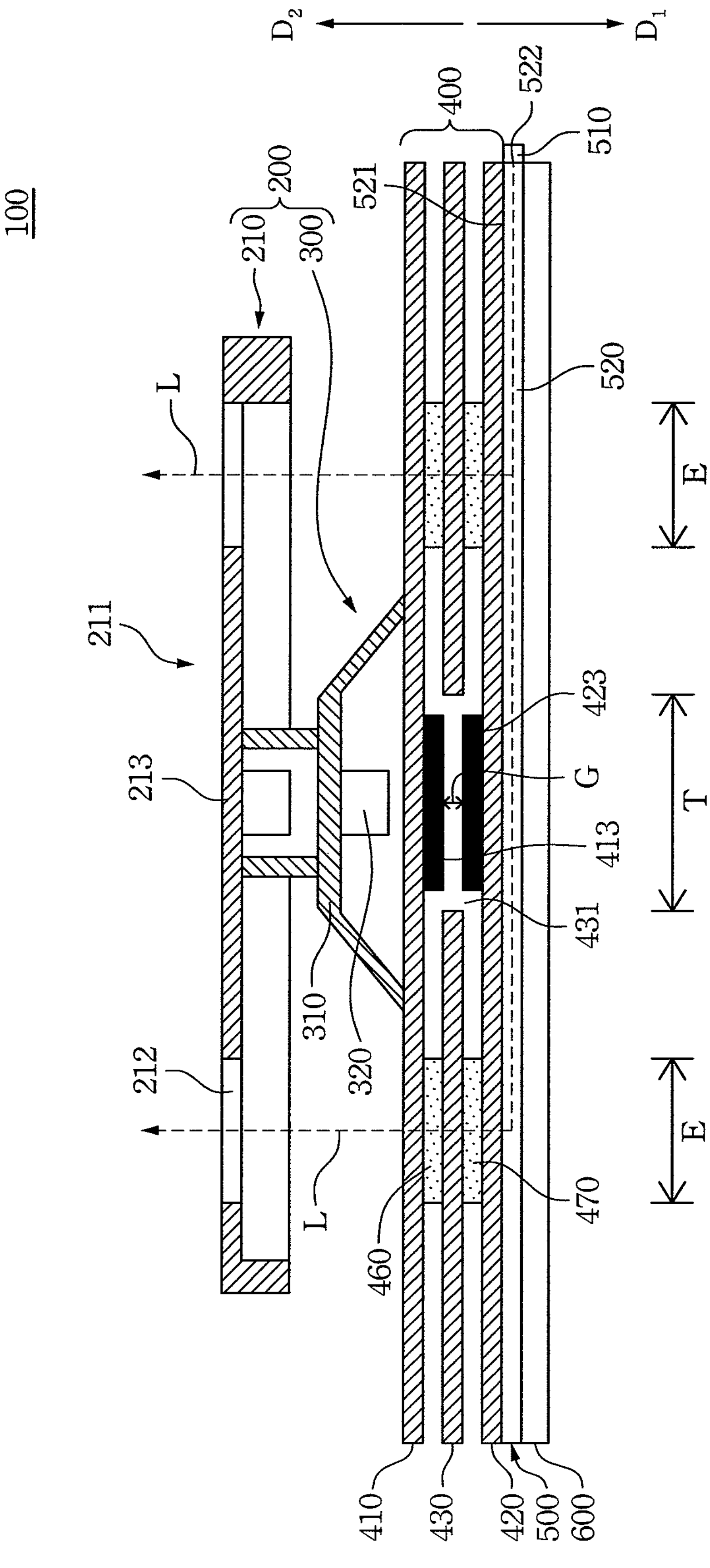
FIG. 2 is a sectional view of FIG. 1 along with line 2-2 according to an embodiment of the present invention.

Refer to FIG. 1 and FIG. 2 in which FIG. 1 is a schematic view of a keyboard 100 of the present invention, and FIG. 2 is a sectional view of FIG. 1 along with line 2-2 according to an embodiment of the present invention.

According to an embodiment of the present invention, the keyboard 100 specifically includes a plurality of key elements 200, a membrane circuit board 400, an emitting layer 500, and a back plate 600 along with a direction D1 of FIG. 2. Each key element 200 includes a keycap 210 and a elastic element 300. The keycaps 210 are respectively configured on a surface of the keyboard 100. Each elastic element 300 is positioned between one of the keycaps 210 and the membrane circuit board 400, and physically connected both the keycap 210 and the membrane circuit board 400 for supporting and regressing the corresponding keycap 210. The elastic element 300, for example, can be a rubber dome 310 (FIG. 2), a linked member (not shown) or a combination of the rubber member and the linked member.

The elastic element 300 extends a pressing rod 320 towards the membrane circuit board 400 according to the direction D1. The emitting layer 500 includes at least one emitting element 510 (e.g. light emitting diode, LED) and a light guide plate 520. The light guide plate 520 is disposed on one side of the membrane circuit board 400 in parallel with the membrane circuit board 400, and is provided with a light output surface 521 and a light incident surface 522. The light output surface 521 of the light guide plate 520 faces the membrane circuit board 400 and the key elements 200. The light incident surface 522 of the light guide plate 520 faces the emitting element 510. The back plate 600 is disposed on one side of the emitting layer 500 for supporting the emitting layer 500, the membrane circuit board 400 and the key elements 200.

Furthermore, the keycap 210 is provided with a pressing face 211 at a top thereof. The pressing face 211 has one or more light-pervious patterns 212 and an opaque area 213 (e.g. black mask or coating). The light-pervious patterns 212 aligns with the light output surface 521 such that lights L can be output outwards the light-pervious patterns 212. The light-pervious patterns 212 can be practiced as character symbols, numeral symbols, geometric symbols or the combination thereof. The opaque area 213 is the rest area of the pressing face 211 other than the light-pervious patterns 212 to surround the light-pervious patterns 212. Thus, the light L emitted by the emitting layer 500 will be more obviously to transmit through the light-pervious patterns 212.

Figure 3A:
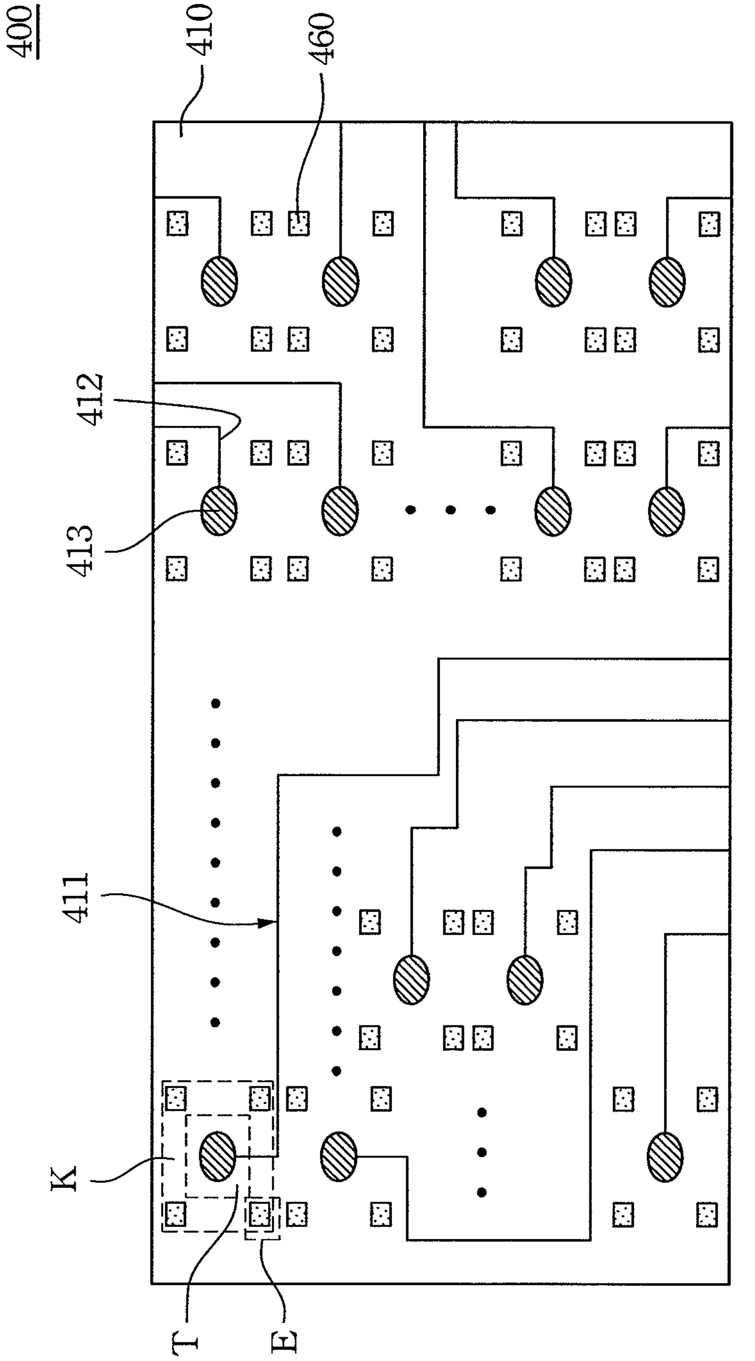
FIG. 3A is a plain schematic view of FIG. 2 shown the first light-pervious membrane and the first light-pervious adhesive layer through the membrane circuit board according to a direction D2.
Figure 3B:
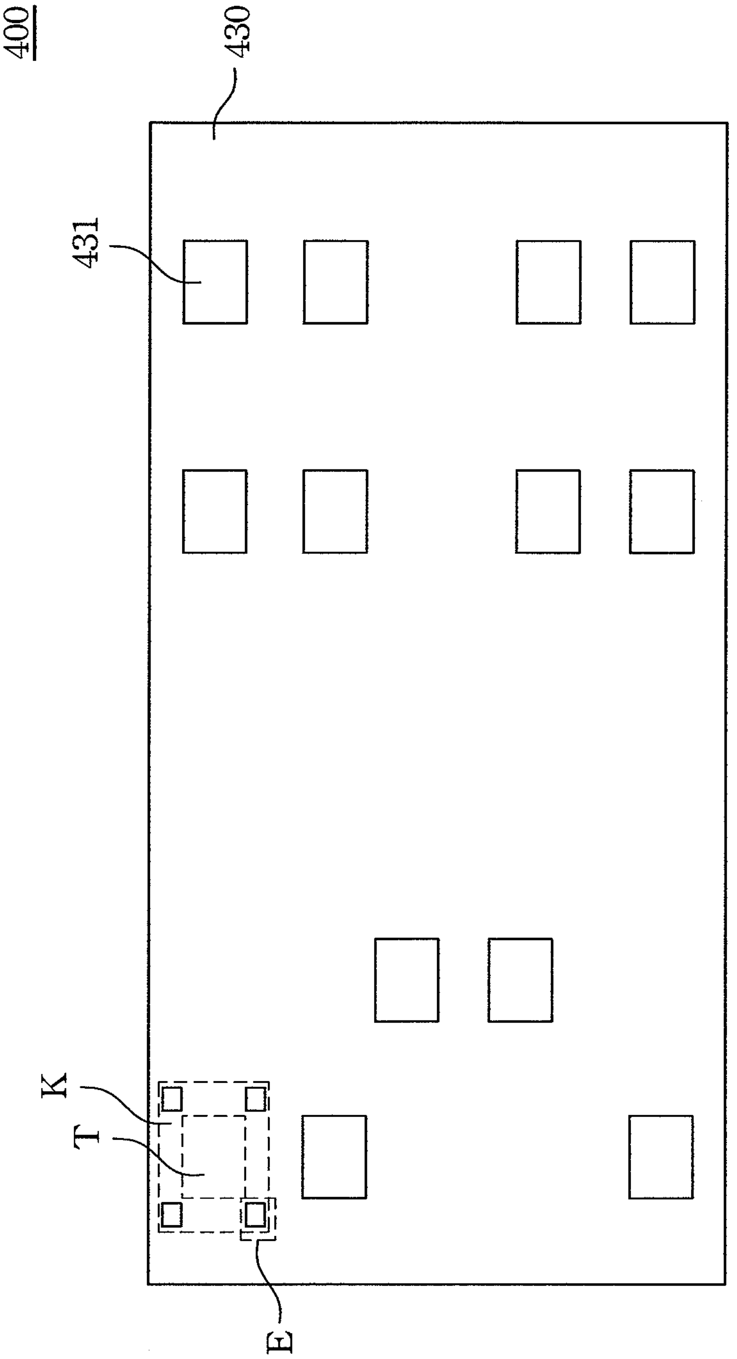
FIG. 3B is a plain schematic view of FIG. 2 shown the third light-pervious membrane sandwiched between the first light-pervious membrane and the second light-pervious membrane.
Figure 3C:
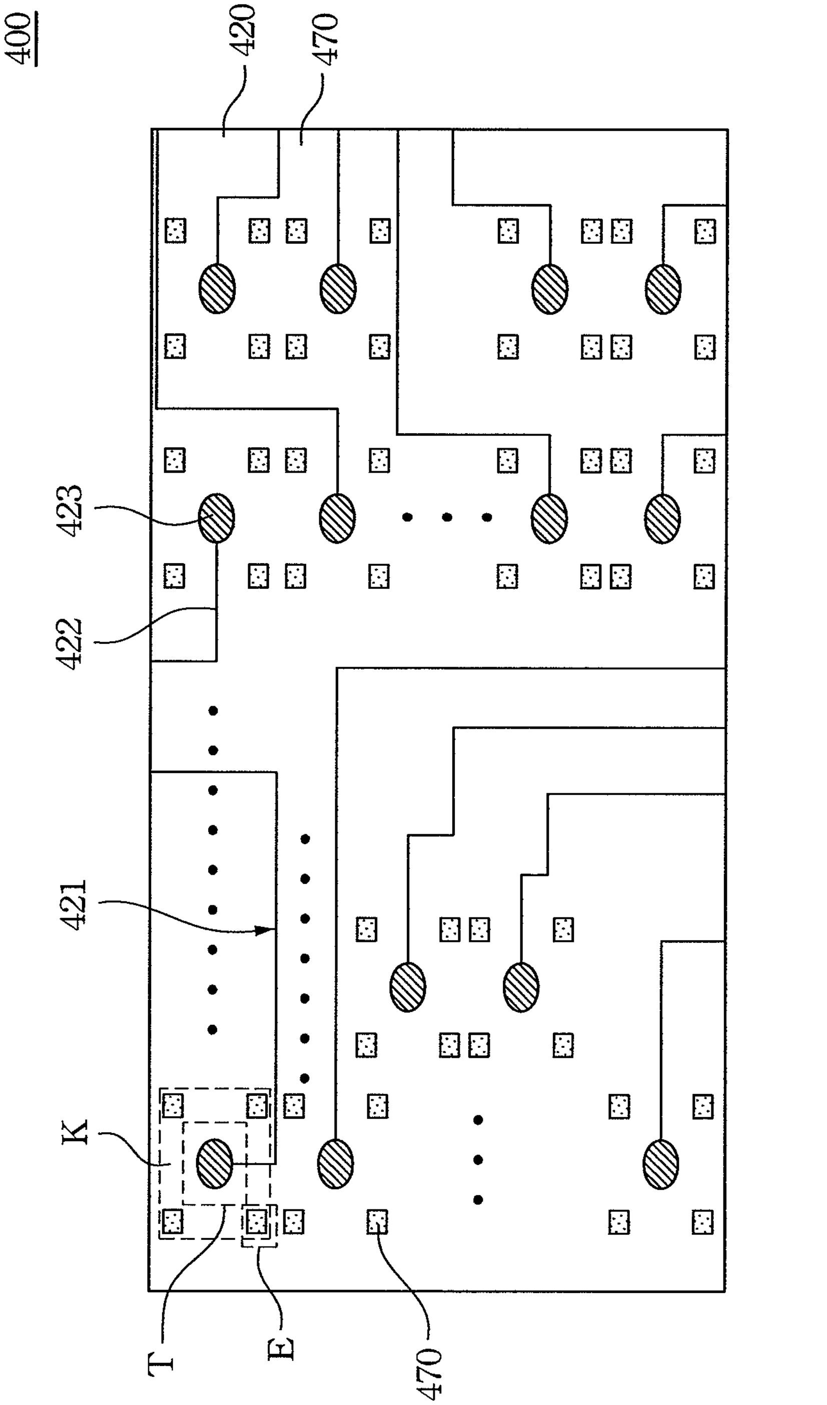
FIG. 3C is a plain schematic view of FIG. 2 shown the second light-pervious membrane and the second light-pervious adhesive layer through the membrane circuit board according to a direction D1.

Refer to FIG. 2 and FIG. 3A to FIG. 3C in which FIG. 3A is a plain schematic view of FIG. 2 shown the first light-pervious adhesive layer 460 and the first light-pervious membrane 410 through the membrane circuit board 400 according to a direction D2, FIG. 3B is a plain schematic view of FIG. 2 shown the third light-pervious membrane 430 sandwiched between the first light-pervious adhesive layer 460 and the second light-pervious adhesive layer 470, and FIG. 3C is a plain schematic view of FIG. 2 shown the second light-pervious adhesive layer 470 and the second light-pervious membrane 420 through the membrane circuit board 400 according to a direction D1.

The membrane circuit board 400 is arranged between the key elements 200 and the emitting layer 500, and defined with a plurality of key regions K spread horizontally thereon. Each key region K is specifically defined with a plurality of light-pervious regions E and a pressing region T thereon. The pressing regions T are respectively disposed for aligning vertically with the key elements 200 (e.g. the elastic element 300) one on one. The light-pervious regions E are respectively aligned vertically with the light-pervious patterns 212 one on one, that is, each light-pervious region E is only located at a vertical projection zone vertically projected on the membrane circuit board 400 by the aligned light-pervious pattern 212.

Specifically, in the embodiment, the area of each light-pervious pattern 212 on the pressing face 211 of the keycap 210 is equal to the area of each light-pervious region E on the membrane circuit board 400.

However, in another variation, each key region also can be simplified to have a single light-pervious region and a single pressing region thereon only.

In the embodiment, the membrane circuit board 400 comprises a plurality of light-pervious membranes which is more than 3 in the quantity. Specifically, the membrane circuit board 400 at least includes a first light-pervious membrane 410, a second light-pervious membrane 420, a third light-pervious membrane 430, an upper circuit pattern 411, a lower circuit pattern 421, a first light-pervious adhesive layer 460 and a second light-pervious adhesive layer 470 (FIG. 2). By applying the first light-pervious adhesive layer 460 and the second light-pervious adhesive layer 470 on every two neighboring light-pervious membranes 410, 420, 430, the first light-pervious membrane 410, the third light-pervious membrane 430, and the second light-pervious membrane 420 are stacked with each other so as to form a multilayer.

The upper circuit pattern 411 is overlaid on an inner surface of the first light-pervious membrane 410 facing to the second light-pervious membrane 420. The lower circuit pattern 421 is overlaid on an inner surface of the second light-pervious membrane 420. The third light-pervious membrane 430 is sandwiched between the first light-pervious membrane 410 and the second light-pervious membrane 420, and electrically isolated the upper circuit pattern 411 of the first light-pervious membrane 410 from the lower circuit pattern 421 of the second light-pervious membrane 420.

The first light-pervious membrane 410 and the third light-pervious membrane 430 are coupled together by the first light-pervious adhesive layer 460. Thus, the first light-pervious adhesive layer 460 is sandwiched between the first light-pervious membrane 410 and the third light-pervious membrane 430, and a light-pervious adhesive material of the first light-pervious adhesive layer 460 is fully filled between the first light-pervious membrane 410 and the third light-pervious membrane 430 in the light-pervious regions E, such that the first light-pervious adhesive layer 460 in the light-pervious regions E relative to the first light-pervious membrane 410 and the third light-pervious membrane 430 can be air-tight, respectively. Oppositely, the first light-pervious adhesive layer 460 between the first light-pervious membrane 410 and the third light-pervious membrane 430 relative to the pressing region T can be a hollow potion having none of the light-pervious adhesive material.

The second light-pervious membrane 420 and the third light-pervious membrane 430 are coupled together by the second light-pervious adhesive layer 470. Thus, the second light-pervious adhesive layer 470 is sandwiched between the second light-pervious membrane 420 and the third light-pervious membrane 430, and a light-pervious adhesive material of the second light-pervious adhesive layer 470 is fully filled between the second light-pervious membrane 420 and the third light-pervious membrane 430 in the light-pervious regions E, such that the second light-pervious adhesive layer 470 in the light-pervious regions E relative to the second light-pervious membrane 420 and the third light-pervious membrane 430 can be air-tight, respectively. Oppositely, the second light-pervious adhesive layer 470 between the second light-pervious membrane 420 and the third light-pervious membrane 430 relative to the pressing region T can be a hollow potion having none of the light-pervious adhesive material.

The upper circuit pattern 411 comprises a plurality of upper printed wires 412 and a plurality of upper electrode points 413. The upper printed wires 412 connect the upper electrode points 413, respectively. The upper electrode points 413 are respectively located in the pressing regions T one on one, and are not covered by the light-pervious adhesive material of the first light-pervious adhesive layer 460. The lower circuit pattern 421 comprises a plurality of lower printed wires 422 and a plurality of lower electrode points 423. The lower printed wires 422 connect one of the lower electrode points 423, respectively. The lower electrode points 423 are respectively located in the pressing regions T one on one, and are not covered by the light-pervious adhesive material of the second light-pervious adhesive layer 470. The lower electrode points 423 respectively are aligned straightly to the upper electrode point 413 one on one, and a gap G is maintained between the corresponding upper electrode point 413 and the lower electrode point 423, and the gap G has no physical obstacle therein.

Furthermore, the third light-pervious membrane 430 has a plurality of first openings 431. The first openings 431 are respectively located in the pressing regions T one on one, and arranged between the corresponding upper electrode point 413 and the lower electrode point 423.

Therefore, a space area in the pressing region T between the first light-pervious membrane 410 and the third light-pervious membrane 430 can be communicated with a space area in the pressing region T between the second light-pervious membrane 420 and the third light-pervious membrane 430 via the corresponding first opening 431. So, a gap G without physical obstacle can be maintained between the corresponding lower electrode point 423 and the upper electrode point 413 so as to achieve the upper electrode point 413 physically/electrically connecting the lower electrode point 423.

Therefore, when lights L of the light guide plate 520 from the light output surface 521 passed through the membrane circuit board 400, since the light-pervious adhesive materials are fully filled in the light-pervious regions E between every two light-pervious membranes, the lights L thereof can effectively progress through the light-pervious regions E according a direction towards the light-pervious patterns 212 (as the direction D2 in FIG. 2) so as to increase light emitting efficiency and advance light outputting brightness of light source.

Figure 4:
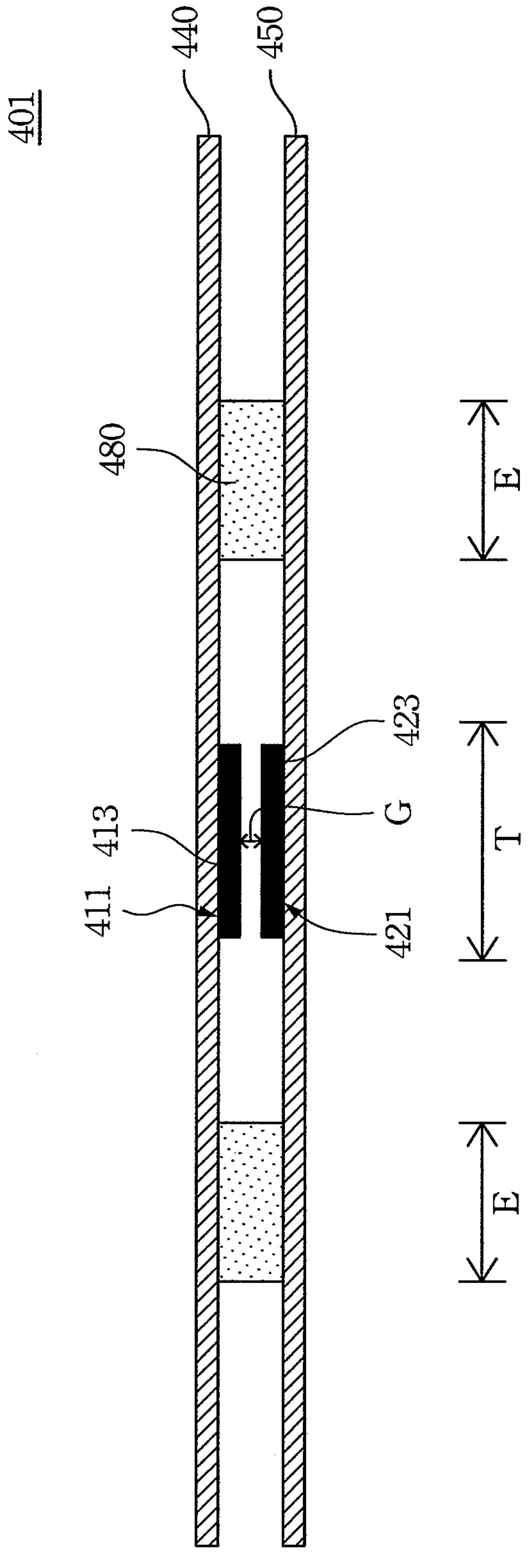
FIG. 4 is a section view of FIG. 1 according to another embodiment of the present invention.

Refer to FIG. 4 in which FIG. 4 is a section view of FIG. 1 according to another embodiment of the present invention.

In the embodiment, the quantity of the light-pervious membranes of the membrane circuit board 401 can be simplified to be 2. Specifically, the membrane circuit board 401 comprises a fourth light-pervious membrane 440, a fifth light-pervious membrane 450 and a third light-pervious adhesive layer 480. The fourth light-pervious membrane 440 and the fifth light-pervious membrane 450 are stacked together to form a multilayer by the third light-pervious adhesive layer 480. The upper circuit pattern 411 is overlaid on an inner surface of fourth light-pervious membrane 440. The lower circuit pattern 421 is overlaid on an inner surface of the fifth light-pervious membrane 450 facing to the fourth light-pervious membrane 440. The third light-pervious adhesive layer 480 is sandwiched between the fourth light-pervious membrane 440 and the fifth light-pervious membrane 450 so as to separate the fourth light-pervious membrane 440 and the fifth light-pervious membrane 450, and electrically isolate the upper circuit pattern 411 of the fourth light-pervious membrane 440 and the lower circuit pattern 421 of the fifth light-pervious membrane 450. The light-pervious adhesive materials of the third light-pervious adhesive layer 480 are fully filled in the light-pervious regions E between the fourth light-pervious membrane 440 and the fifth light-pervious membrane 450, respectively.

Thus, the third light-pervious adhesive layer 480 in the light-pervious regions E relative to the fourth light-pervious membrane 440 and the fifth light-pervious membrane 450 can be air-tight, respectively.

Since the features of the upper circuit pattern 411 and the lower circuit pattern 421 are same as mentioned above, the abovementioned features of the upper circuit pattern 411 and the lower circuit pattern 421 are not further described here again.

Figure 5:
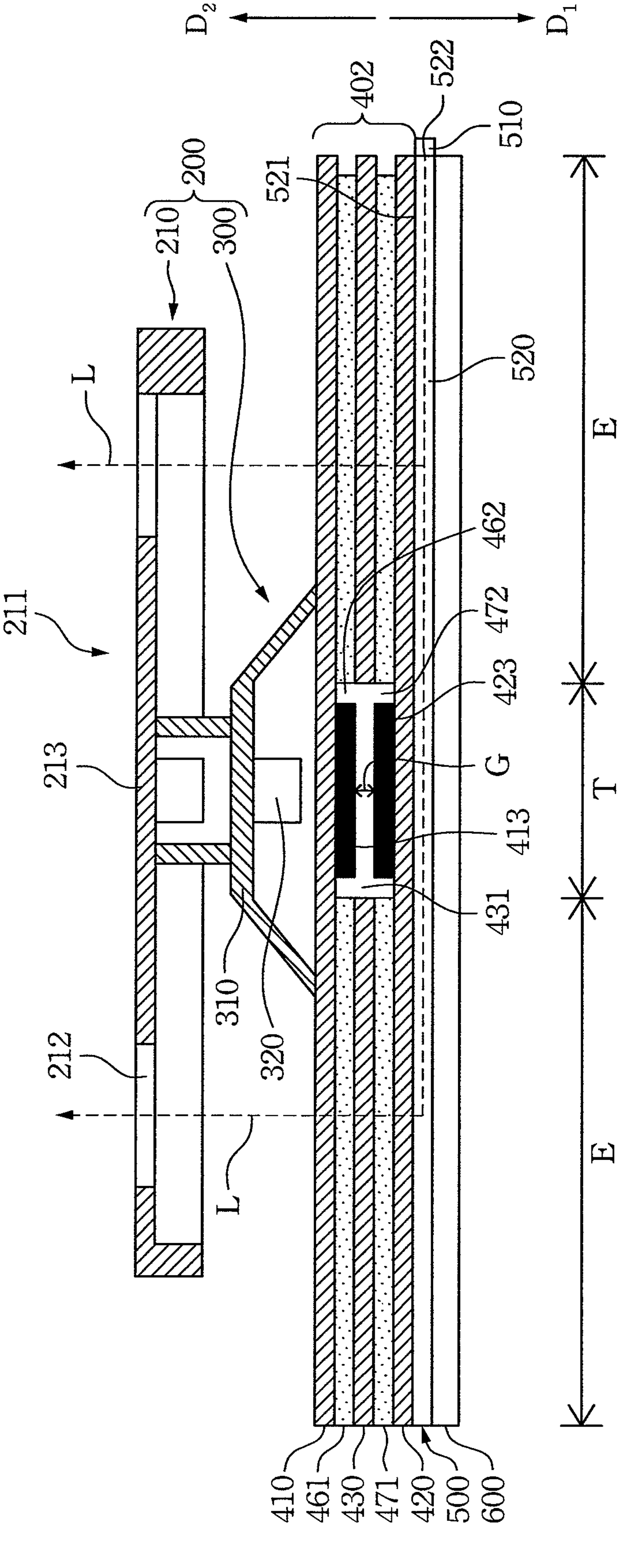
FIG. 5 is a section view of FIG. 1 according to the other embodiment of the present invention.
Figure 6A:
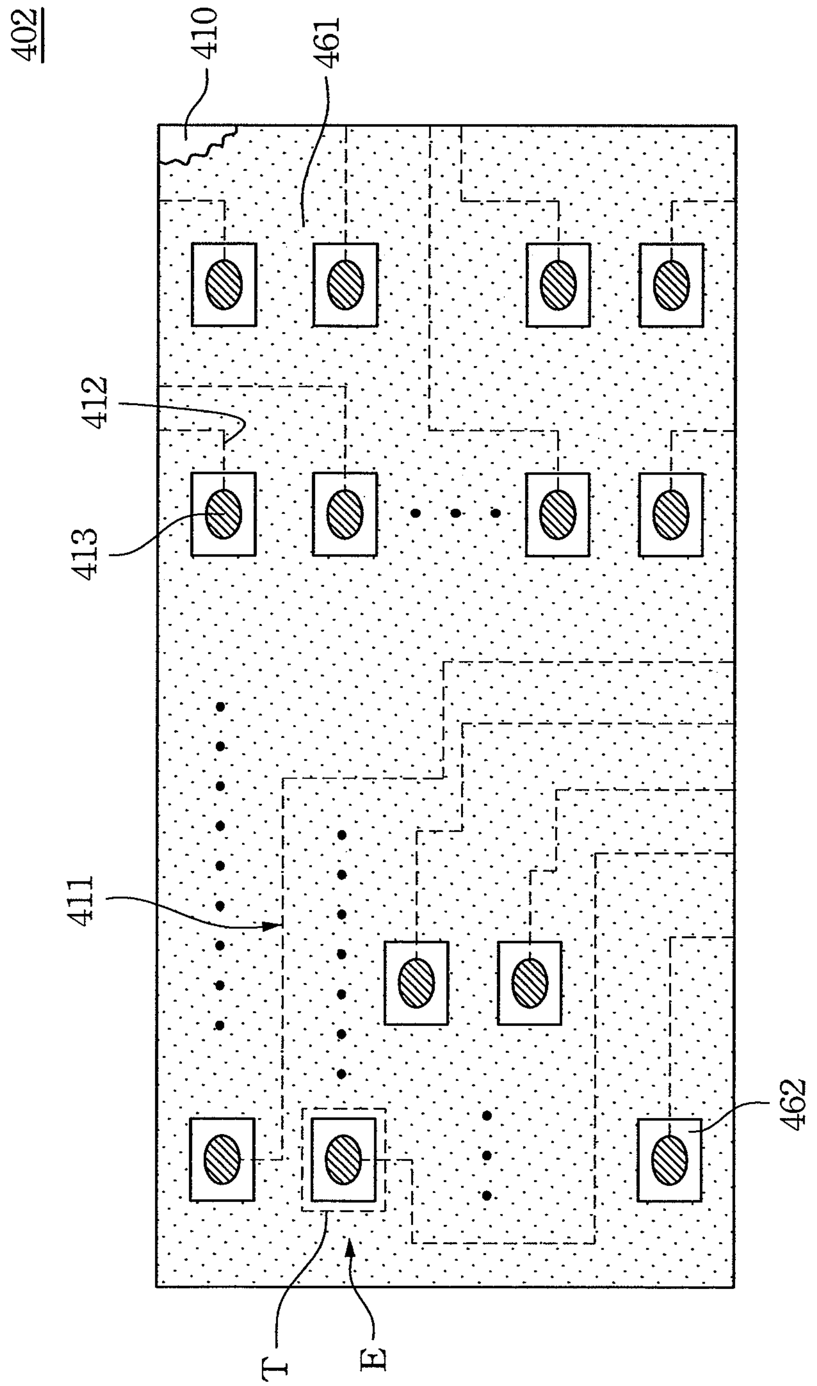
FIG. 6A is a plain schematic view of FIG. 5 shown the first light-pervious membrane and the first light-pervious adhesive layer through the membrane circuit board according to a direction D2.
Figure 6B:
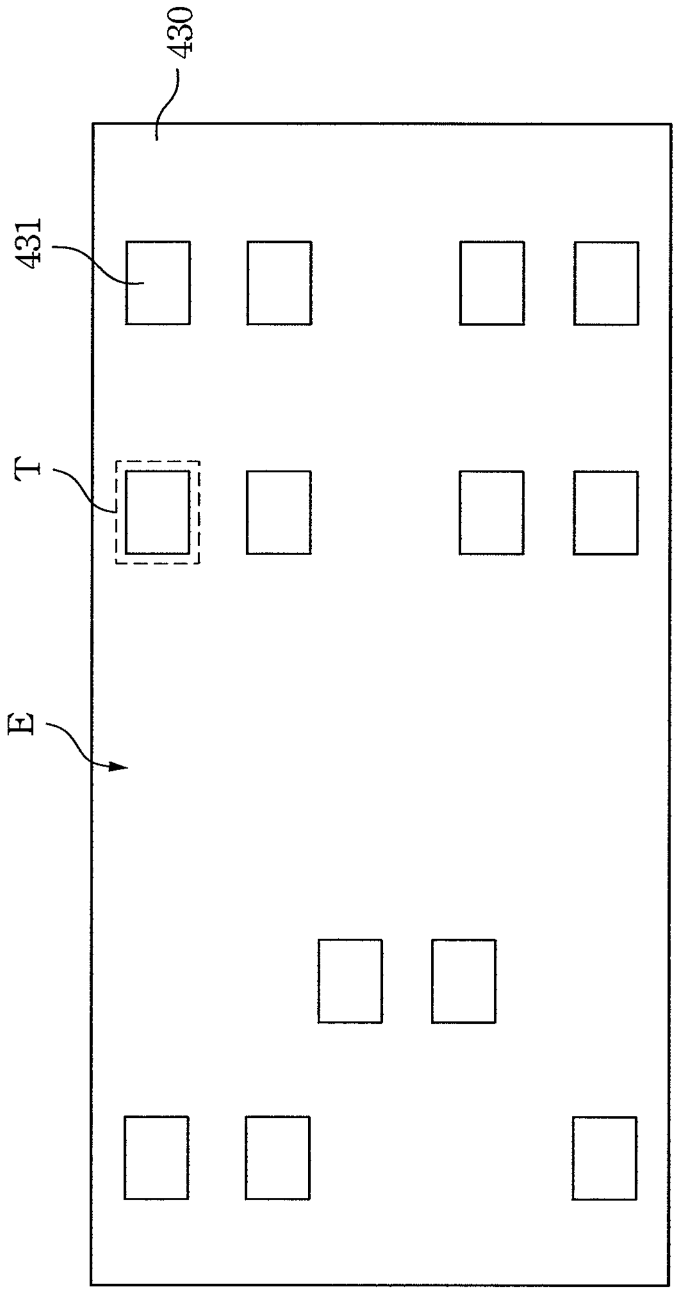
FIG. 6B is a plain schematic view of FIG. 5 shown the third light-pervious membrane sandwiched between the first light-pervious membrane and the second light-pervious membrane.
Figure 6C:
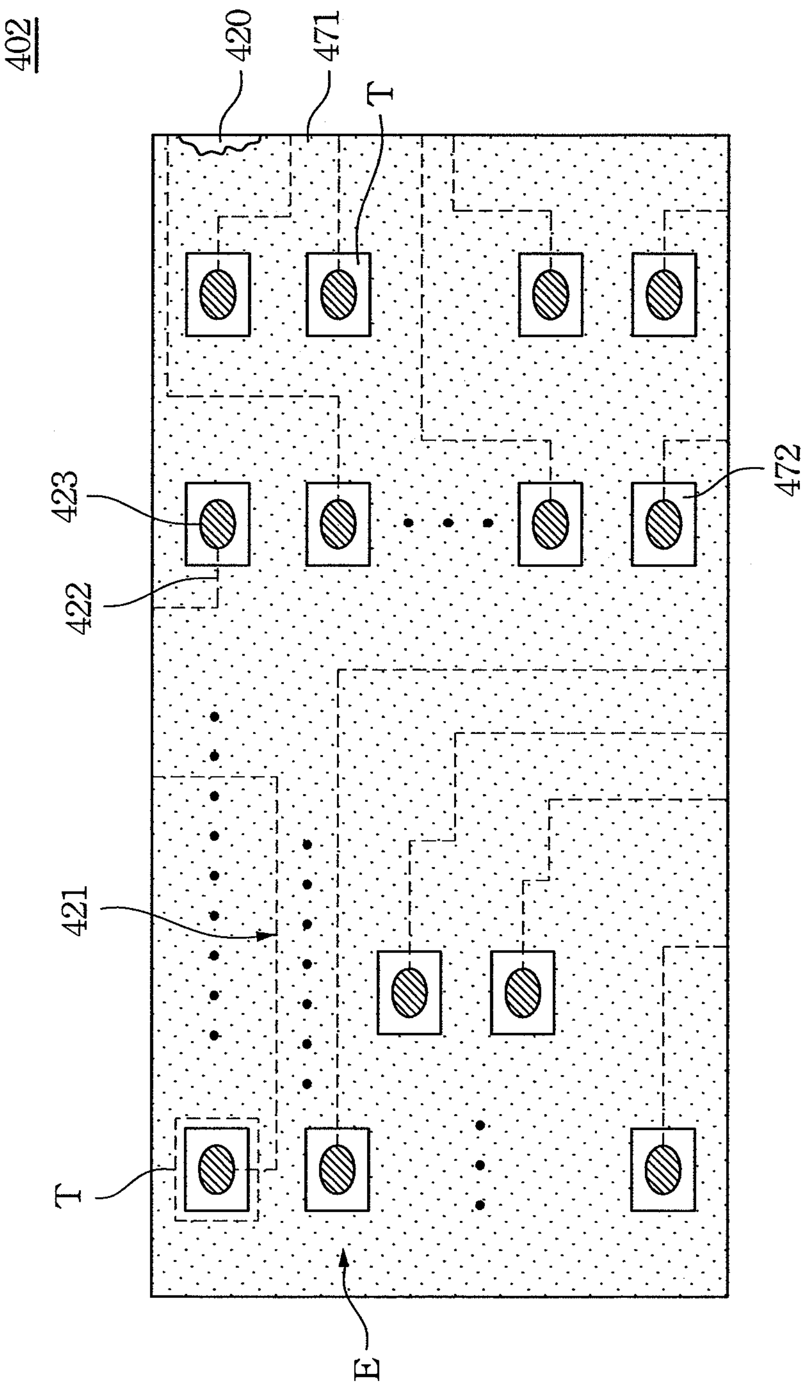
FIG. 6C is a plain schematic view of FIG. 5 shown the second light-pervious membrane and the second light-pervious adhesive layer through the membrane circuit board according to a direction D1.

Refer to FIG. 5, FIG. 6A to FIG. 6C in which FIG. 5 is a section view of FIG. 1 according to the other embodiment of the present invention; FIG. 6A is a plain schematic view of FIG. 5 shown the first light-pervious membrane 410 and the first light-pervious adhesive layer 461 through the membrane circuit board 402 according to a direction D2; FIG. 6B is a plain schematic view of FIG. 5 shown the third light-pervious membrane 430 sandwiched between the first light-pervious membrane 410 and the second light-pervious membrane 420; and FIG. 6C is a plain schematic view of FIG. 5 shown the second light-pervious membrane 420 and the second light-pervious adhesive layer 471 through the membrane circuit board 402 according to a direction D1.

The membrane circuit board 402 is arranged between the key elements 200 and the emitting layer 500, and defined with a single light-pervious region E and a plurality of pressing regions T thereon. The pressing regions T are respectively disposed for aligning vertically with the key elements 200 one on one, and are all surrounded by the light-pervious region E (FIG. 6A). In the embodiment, the membrane circuit board 402 comprises a plurality of light-pervious membranes which is more than 3 in the quantity.

Specifically, the membrane circuit board 402 at least includes a first light-pervious membrane 410, a second light-pervious membrane 420, a third light-pervious membrane 430, an upper circuit pattern 411, a lower circuit pattern 421, a first light-pervious adhesive layer 461 and a second light-pervious adhesive layer 471 (FIG. 5). By applying the first light-pervious adhesive layer 461 and the second light-pervious adhesive layer 471 on every two neighboring light-pervious membranes 410, 420, 430, the first light-pervious membrane 410, the third light-pervious membrane 430, and the second light-pervious membrane 420 are stacked with each other so as to form a multilayer. The upper circuit pattern 411 is overlaid on an inner surface of the first light-pervious membrane 410 facing to the second light-pervious membrane 420. The lower circuit pattern 421 is overlaid on an inner surface of the second light-pervious membrane 420. The third light-pervious membrane 430 is sandwiched between the first light-pervious membrane 410 and the second light-pervious membrane 420, and electrically isolated the upper circuit pattern 411 of the first light-pervious membrane 410 from the lower circuit pattern 421 of the second light-pervious membrane 420.

The first light-pervious membrane 410 and the third light-pervious membrane 430 are coupled together by the first light-pervious adhesive layer 460. Thus, the first light-pervious adhesive layer 460 is sandwiched between the first light-pervious membrane 410 and the third light-pervious membrane 430, and a light-pervious adhesive material of the first light-pervious adhesive layer 460 is fully filled between the first light-pervious membrane 410 and the third light-pervious membrane 430 in the light-pervious region E, such that the first light-pervious adhesive layer 461 in the light-pervious region E relative to the first light-pervious membrane 410 and the third light-pervious membrane 430 can be air-tight, respectively.

Furthermore, since the light-pervious adhesive material of the first light-pervious adhesive layer 461 is fully filled in the light-pervious region E between the first light-pervious membrane 410 and the third light-pervious membrane 430, thus, areas that the first light-pervious adhesive layer 461 surrounds the pressing regions T respectively generate a first hollow portion 462. Each first hollow portion 462 in the pressing region T between the first light-pervious membrane 410 and the third light-pervious membrane 430 is hollow and with none of light-pervious adhesive material.

The second light-pervious membrane 420 and the third light-pervious membrane 430 are coupled together by the second light-pervious adhesive layer 471. Thus, the second light-pervious adhesive layer 471 is sandwiched between the second light-pervious membrane 420 and the third light-pervious membrane 430, and a light-pervious adhesive material of the second light-pervious membrane 471 is fully filled between the second light-pervious membrane 420 and the third light-pervious membrane 430 in the light-pervious region E, such that the second light-pervious adhesive layer 471 in the light-pervious region E relative to the second light-pervious membrane 420 and the third light-pervious membrane 430 can be air-tight, respectively.

Furthermore, since the light-pervious adhesive material of the second light-pervious adhesive layer 471 is fully filled in the light-pervious region E between the second light-pervious membrane 420 and the third light-pervious membrane 430, thus, areas that the second light-pervious adhesive layer 471 surrounds the pressing regions T respectively generate a second hollow portion 472. Each second hollow portion 472 in the pressing region T between the second light-pervious membrane 420 and the third light-pervious membrane 430 is hollow and with none of light-pervious adhesive material.

Since the features of the upper circuit pattern 411 and the lower circuit pattern 421 are similar to mentioned above, besides the abovementioned features of the upper circuit pattern 411 and the lower circuit pattern 421 are not further described here again, the upper printed wires 412 are covered in the light-pervious region E by the first light-pervious adhesive layer 461 and the lower printed wires 422 are covered in the light-pervious region E by the second light-pervious adhesive layer 471. Also, the features of the first openings 431 are same as mentioned above, the abovementioned features thereof are not further described here again.

Therefore, when lights L of the light guide plate 520 from the light output surface 521 passed through the membrane circuit board 400, since the light-pervious adhesive materials are fully filled in the light-pervious regions E between every two light-pervious membranes, massive lights L thereof will progress through the light-pervious regions E according a direction towards the key elements 200 (as the direction D2 in FIG. 5) so as to increase light emitting efficiency and advance light outputting brightness of light source.

Figure 7:
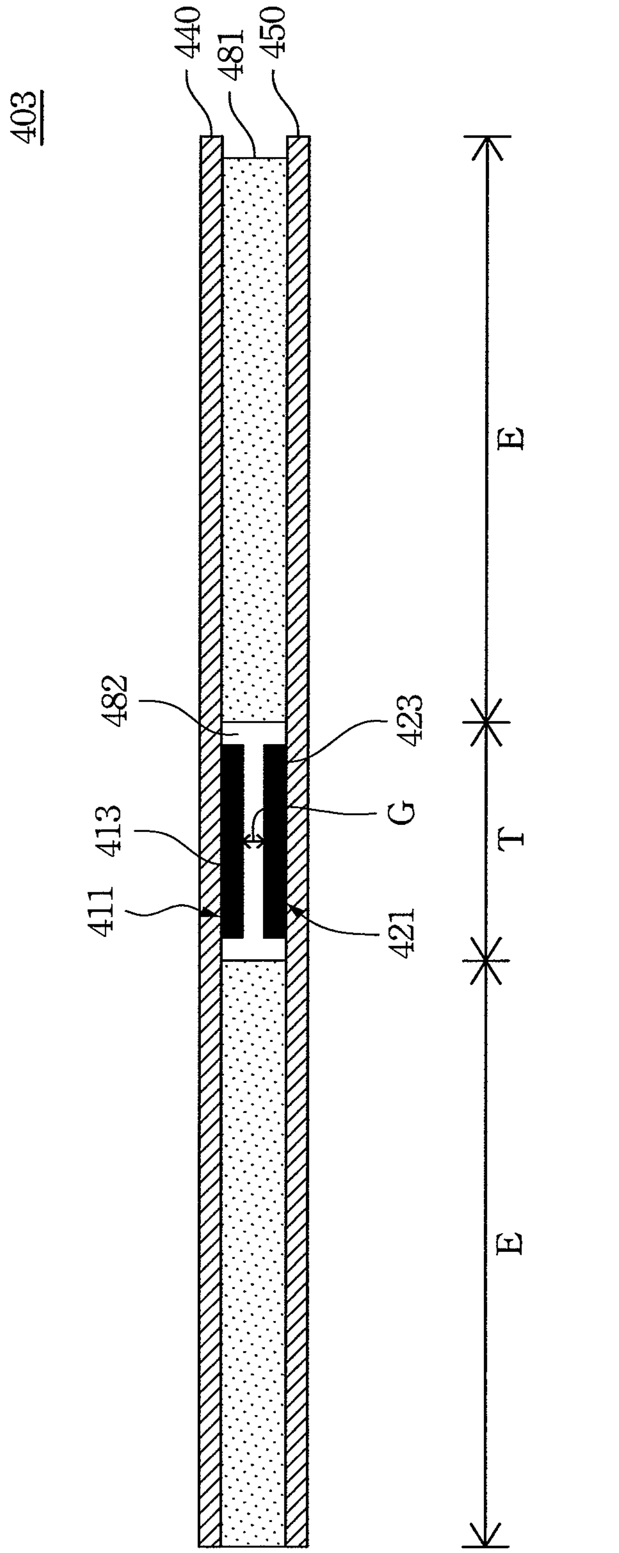
FIG. 7 is a section view of FIG. 1 according to still the other embodiment of the present invention.

Refer to FIG. 7 in which FIG. 7 is a section view of FIG. 1 according to still the other embodiment of the present invention.

In the embodiment, the quantity of the light-pervious membranes of the membrane circuit board 403 can be simplified to be 2. Specifically, the membrane circuit board 403 comprises a fourth light-pervious membrane 440, a fifth light-pervious membrane 450 and a third light-pervious adhesive layer 481.

The fourth light-pervious membrane 440 and the fifth light-pervious membrane 450 are stacked together to form a multilayer by the third light-pervious adhesive layer 481. The upper circuit pattern 411 is overlaid on an inner surface of fourth light-pervious membrane 440. The lower circuit pattern 421 is overlaid on an inner surface of the fifth light-pervious membrane 450 facing to the fourth light-pervious membrane 440.

The third light-pervious adhesive layer 481 is sandwiched between the fourth light-pervious membrane 440 and the fifth light-pervious membrane 450 so as to electrically isolate the upper circuit pattern 411 of the fourth light-pervious membrane 440 and the lower circuit pattern 421 of the fifth light-pervious membrane 450. The light-pervious adhesive materials of the third light-pervious adhesive layer 481 are fully filled in the light-pervious regions E between the fourth light-pervious membrane 440 and the fifth light-pervious membrane 450, respectively.

Thus, the third light-pervious adhesive layer 481 in the light-pervious regions E relative to the fourth light-pervious membrane 440 and the fifth light-pervious membrane 450 can be air-tight, respectively.

Since the features of the upper circuit pattern 411 and the lower circuit pattern 421 are same as mentioned above, the abovementioned features of the upper circuit pattern 411 and the lower circuit pattern 421 are not further described here again. The upper printed wires 412 of the upper circuit pattern 411 and the lower printed wires 422 of the lower circuit pattern 421 are all covered by the third light-pervious adhesive layer 481.

Furthermore, the third light-pervious adhesive layer 481 has a plurality of second openings 482. The second openings 482 are respectively located in the pressing regions T one on one, and arranged between the corresponding upper electrode point 413 and the lower electrode point 423.

Therefore, a gap G without physical obstacle can be maintained between the corresponding lower electrode point 423 and the upper electrode point 413 via each second opening 482 so as to achieve the upper electrode point 413 physically/electrically connecting the lower electrode point 423.

Types of the mentioned keyboard 100 are not limited in an independent keyboard (e.g. wired or wireless keyboard device) or an embedded keyboard assembling into a portable electric device (e.g. notebook or mobile phone). Types of the mentioned keyboard 100 are not limited in a normal keyboard, a chocolate type keyboard, an island-style keyboard and a floating-style keyboard.

The mentioned keyboards 100 in the embodiments of the present invention can be implemented on an electric device, thus, the keyboard of the electric device can have better indicating light functions. Types of the mentioned electric device are not limited in the present invention, and are all in the scope of the present invention which is intended to be defined by the appended claims as long as the electric devices with the mentioned keyboard 100. The mentioned electric device can be one of notebooks, mobile phones, video cameras, photo cameras, game devices, language translation devices, music players, display screens, digital photo frames and lamp tools.

Although the present invention has been described with reference to the preferred embodiments thereof, it is apparent to those skilled in the art that a variety of modifications and changes may be made without departing from the scope of the present invention which is intended to be defined by the appended claims.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A keyboard, comprising:
- a keycap comprising at least one light-pervious pattern;
- an emitting layer outputting lights towards the keycap;
- an elastic element arranged between the keycap and the emitting layer, and coupling to the keycap; and
- a membrane circuit board arranged between the elastic element and the emitting layer, and having a pressing region and at least one light-pervious region thereon, wherein the pressing region is aligned with the elastic element, and the light-pervious region is at least located at a vertical projection zone vertically projected on the membrane circuit board by the light-pervious pattern, and the membrane circuit board comprises:
  - a plurality of light-pervious membranes stacked with each other; and
  - at least one light-pervious adhesive layer sandwiched between every two neighboring light-pervious membranes, and fully filled in the light-pervious region.

2. The keyboard according to claim 1, wherein the light-pervious region is only in the vertical projection zone, and an area of the light-pervious region is equal to an area of the light-pervious pattern.

3. The keyboard according to claim 1, wherein an area of the light-pervious region is greater than an area of the light-pervious pattern, and the light-pervious region surrounds the pressing region, wherein the pressing region is hollow and surrounded completely by the light-pervious adhesive layer.

4. The keyboard according to claim 3, wherein the membrane circuit board further comprises:
- an upper circuit pattern overlaid on an inner surface of one of the light-pervious membranes, the upper circuit pattern comprising an upper electrode point located in the pressing region and aligned straightly to the elastic element; and
- a lower circuit pattern overlaid on an inner surface of another of the light-pervious membranes, comprising a lower electrode point located in the pressing region and aligned straightly to the upper electrode point, and with the upper electrode point,
- wherein the upper electrode point and the lower electrode point are maintained a gap with each other, and have no physical obstacle in the gap.

5. The keyboard according to claim 4, wherein when the quantity of the light-pervious membranes is more than 3, the other one of the light-pervious membranes is sandwiched between the two light-pervious membranes, and electrically isolated the upper circuit pattern and the lower circuit pattern,
- wherein the sandwiched light-pervious membrane has a first opening located in the pressing region, and is arranged between the upper electrode point and the lower electrode point.

6. The keyboard according to claim 4, wherein the quantity of the light-pervious membranes is 2.

7. The keyboard according to claim 6, wherein the light-pervious adhesive layer sandwiched between the two light-pervious membranes physically isolates the upper electrode point and the lower electrode point.

8. The keyboard according to claim 7, wherein the light-pervious adhesive layer sandwiched between the two light-pervious membranes has a second opening, and the second opening is located in the pressing region.

9. The keyboard according to claim 4, wherein the upper circuit pattern further comprising an upper printed wire connected to the upper electrode point and the upper printed wire being covered by the light-pervious adhesive layer;

the lower circuit pattern further comprising a lower printed wire connected to the lower electrode point, and the lower printed wire being covered by the light-pervious adhesive layer.

10. A membrane circuit board defined with a plurality of key regions in which each of the key regions is defined with a pressing region and at least one light-pervious region thereon, the membrane circuit board comprising:

a first light-pervious membrane;

a second light-pervious membrane stacked on a side of the first light-pervious membrane; and an upper circuit pattern overlaid on a surface of the first light-pervious membrane facing to the second light-pervious membrane, the upper circuit pattern comprising:

at least one upper electrode point located in the pressing region; and at least one upper printed wire connected to the upper electrode point;

a lower circuit pattern overlaid on a surface of the second light-pervious membrane facing to the first light-pervious membrane, the lower circuit pattern comprising:

at least one lower electrode point located in the pressing region, straightly aligned the upper electrode point, maintained a gap with the aligned upper electrode point, wherein the gap is with no physical obstacle; and at least one lower printed wire connected to the lower electrode point; and at least one light-pervious adhesive layer sandwiched between the first light-pervious membrane and the second light-pervious membrane, and fully filled in the light-pervious region.

11. The membrane circuit board according to claim 10 further comprising:

a third light-pervious membrane sandwiched between the first light-pervious membrane and the second light-pervious membrane, provided with at least one first opening, the first opening is located in the pressing area and between the upper electrode point and the lower electrode point.

12. A membrane circuit board defined with a plurality of pressing regions thereon and a single light-pervious region surrounding the pressing regions, the membrane circuit board comprising:

a first light-pervious membrane;

a second light-pervious membrane stacked on a side of the first light-pervious membrane; and at least one light-pervious adhesive layer sandwiched between the first light-pervious membrane and the second light-pervious membrane, and the light-pervious adhesive layer comprising:

a light-pervious adhesive material fully filled in the light-pervious region only; and a plurality of hollow portions arranged on the light-pervious adhesive layer and correspondingly aligned to the pressing regions one on one.

13. The membrane circuit board according to claim 12 further comprising:

an upper circuit pattern overlaid on a surface of the first light-pervious membrane facing to the second light-pervious membrane, the upper circuit pattern comprising:

at least one upper electrode point located in one of the pressing regions; and at least one upper printed wire connected to the upper electrode point; and a lower circuit pattern overlaid on a surface of the second light-pervious membrane facing to the first light-pervious membrane, the lower circuit pattern comprising:

at least one lower electrode point located in the pressing region straightly aligned with the upper electrode point, maintained a gap with the aligned upper electrode point, wherein the gap is with no physical obstacle; and at least one lower printed wire connected to the lower electrode point.

14. The membrane circuit board according to claim 13 further comprising:

a third light-pervious membrane sandwiched between the first light-pervious membrane and the second light-pervious membrane, and provided with at least one first opening, wherein the first opening is located in the pressing area and between the upper electrode point and the lower electrode point.

* * * * *